US010492000B2

(12) United States Patent
Poletti

(10) Patent No.: US 10,492,000 B2
(45) Date of Patent: Nov. 26, 2019

(54) CYLINDRICAL MICROPHONE ARRAY FOR EFFICIENT RECORDING OF 3D SOUND FIELDS

(71) Applicant: GOOGLE INC., Mountain View, CA (US)

(72) Inventor: Mark Poletti, Lower Hutt (NZ)

(73) Assignee: GOOGLE LLC, Mountain View, CA (US)

( * ) Notice: Subject to any disclaimer, the term of this patent is extended or adjusted under 35 U.S.C. 154(b) by 42 days.

(21) Appl. No.: 15/094,772

(22) Filed: Apr. 8, 2016

(65) Prior Publication Data

US 2017/0295429 A1    Oct. 12, 2017

(51) Int. Cl.
| | | |
|---|---|---|
| H04R 5/027 | (2006.01) | |
| H04R 1/40 | (2006.01) | |
| H03G 5/16 | (2006.01) | |
| H04R 3/00 | (2006.01) | |
| H04R 19/04 | (2006.01) | |
| G06T 19/00 | (2011.01) | |

(Continued)

(52) U.S. Cl.
CPC ............ *H04R 5/027* (2013.01); *H03G 5/165* (2013.01); *H04R 1/406* (2013.01); *H04R 3/005* (2013.01); *G06F 3/038* (2013.01); *G06F 3/0488* (2013.01); *G06F 2203/0381* (2013.01); *G06T 19/006* (2013.01); *H04R 19/04* (2013.01); *H04R 2201/003* (2013.01); *H04R 2201/401* (2013.01); *H04R 2430/20* (2013.01); *H04S 2400/15* (2013.01); *H04S 2420/11* (2013.01)

(58) Field of Classification Search
CPC .............. H04S 2420/11; H04R 3/005; H04R 2201/401; H04R 1/406; H04R 5/027; H04R 1/2884; H04R 19/04; H04R 2201/003; G01S 3/8006; H03G 5/165
See application file for complete search history.

(56) References Cited

U.S. PATENT DOCUMENTS

| 4,042,779 A | 8/1977 | Craven et al. |
| 5,343,211 A * | 8/1994 | Kott ...................... G01S 7/2813 342/379 |

(Continued)

OTHER PUBLICATIONS

Poletti et al, Higher Order Loudspeakers and Active Compensation for Improved 2D sound field Reproduction in Rooms, AES, Jan. 2015.*

(Continued)

*Primary Examiner* — Davetta W Goins
*Assistant Examiner* — Kuassi A Ganmavo
(74) *Attorney, Agent, or Firm* — Brake Hughes Bellermann LLP

(57) ABSTRACT

Provided are methods, systems, and apparatuses for recording a three-dimensional (3D) sound field using a vertically-oriented cylindrical array with multiple circular arrays at different heights. The design of the cylindrical array is well-suited to providing a high-resolution in azimuth and a reduced resolution in elevation, and offers improved performance over existing 3D sound reproduction systems. The methods, systems, and apparatuses provide a larger vertical aperture than horizontal aperture, as opposed to a spherical array, which has the same aperture for all dimensions, and further provides an alternative format to mixed-order spherical decomposition.

20 Claims, 8 Drawing Sheets

(51) Int. Cl.
G06F 3/038      (2013.01)
G06F 3/0488     (2013.01)

(56) References Cited

U.S. PATENT DOCUMENTS

| | | | |
|---|---|---|---|
| 6,434,539 B1* | 8/2002 | Woodsum | H01Q 3/26 |
| | | | 342/373 |
| RE38,350 E | 12/2003 | Godfrey | |
| 7,133,530 B2 | 11/2006 | Poletti | |
| 7,158,645 B2 | 1/2007 | June et al. | |
| 7,839,721 B1* | 11/2010 | Clark | H04R 3/005 |
| | | | 367/119 |
| 7,852,369 B2 | 12/2010 | Cutler et al. | |
| 8,077,540 B2 | 12/2011 | Williams | |
| 8,090,117 B2 | 1/2012 | Cox | |
| 8,406,436 B2 | 3/2013 | Craven et al. | |
| 8,903,106 B2 | 12/2014 | Meyer et al. | |
| 8,976,977 B2 | 3/2015 | de Sena et al. | |
| 9,197,962 B2 | 11/2015 | Elko et al. | |
| 2003/0065262 A1* | 4/2003 | Stergiopoulos | G01S 7/52046 |
| | | | 600/437 |
| 2003/0118200 A1 | 6/2003 | Beaucoup et al. | |
| 2006/0262939 A1* | 11/2006 | Buchner | H04M 9/08 |
| | | | 381/56 |
| 2007/0274534 A1* | 11/2007 | Lockhart | H04R 1/406 |
| | | | 381/92 |
| 2010/0202628 A1* | 8/2010 | Meyer | H04R 1/406 |
| | | | 381/92 |
| 2012/0275621 A1* | 11/2012 | Elko | H04R 19/016 |
| | | | 381/92 |
| 2012/0327115 A1* | 12/2012 | Chhetri | H04R 3/005 |
| | | | 345/633 |
| 2014/0270245 A1* | 9/2014 | Elko | H04R 3/005 |
| | | | 381/92 |
| 2014/0286493 A1 | 9/2014 | Kordon et al. | |
| 2015/0117672 A1 | 4/2015 | Christoph | |
| 2015/0213811 A1* | 7/2015 | Elko | H04R 3/005 |
| | | | 381/92 |

OTHER PUBLICATIONS

Trevino et al, Mixed order ambisonics encoding of cylindrical microphone array signals, ASJ, 2014.*
Stergiopoulos et al, Advnace Signal processing Handbook Theory and Implementation for Radar,2000.*
Farina et al, Spatial Sound recording with dense microphone array, AES, 2014.*
Poletti, Three Dimensional Surround Sound Systems based on Spherical Harmonics, AES, 2005.*
Lopez, A formulation of ambisonics in unconventional geometries, Mar. 2014.*
Meyer, Beamforming for a circular microphone array mounted on spherically shaped objects, ASA, 2001.*
Meshkar et al, A Beamforming Method for Cylindrical Array Decomposition Approach, ICEE 2012.*
Hou et al, Efficient design of Nearfield Focused beamformer with Frequency invariant patterns for Vertical Line Array, IEEE, 2013.*
Cho et al, Optimization of vertical and horizontal beamforming kernels on the powerpc g4 processor with altivec technology, IEEE, 2000 (Year: 2000).*
Stergipoulos, Advanced beamformer, Defense Research and development Canada, 2008 (Year: 2008).*
Meshkar et al, A beamforming method for cylindrical array based on the array decomposition approach, ICEE, 2012 (Year: 2012).*
Abhayapala, T. D. and A. Gupta, "Spherical Harmonic Analysis of Wavefields Using Multiple Circular Sensor Arrays," IEEE Trans. Audio, Speech Lang. Proc., vol. 18, No. 6, pp. 1655-1666, 2010.
Ahrens, J., and S. Spors, "An analytical approach to sound field reproduction using circular and spherical loudspeaker distributions," Acta Acust. united with Acust., vol. 94, pp. 988-999, 2008.

Balmages, I. and B. Rafaely, "Open-Sphere Designs for Spherical Microphone Arrays," IEEE Trans. Audio, Speech Lang. Proc., vol. 15, No. 2, pp. 727-732, 2007.
Bamford, J.S., and J. Vanderkooy, "Ambisonics sound for us," in AES 99th Convention, 1995.
Chen, H., T. D. Abhayapala, and W. Zhang, "3D sound field analysis using circular higher-order microphone array," in 23rd European Signal Processing Conference (EUSIPCO), 2015, pp. 1153-1157.
Daniel, J. "Spatial sound encoding including near field effect: Introducing distance coding filters and a viable new ambisonics format," in AES 23rd International Conference, 2003.
Daniel, J., J.-B. Rault, and J.-D. Polack, "Ambisonics encoding of other audio formats for multiple listening conditions," in AES 105th Convention, 1998.
Farrar, K. "Soundfield microphone: Design and development of microphone and control unit," Wireless World, pp. 48-50, Oct. 1979.
Favrot, S., and M. Marschall, "Metrics for performance assessment of mixed-order ambisonics spherical microphone arrays," in AES 25th UK Conference, 2012.
Favrot, S., M. Marschall, J. Käsbach, J. Buchholz, and T. Welle, "Mixed-order Ambisonics recording and playback for improving horizontal directionality," in 131st Audio Engineering Society Convention, 2011, vol. 2, pp. 641-647.
Fellgett, P. B. "Ambisonic reproduction of directionality in surround-sound systems," Nature, vol. 252, No. 5484. Nature Publishing Group, pp. 534-538, 1974.
Gerzon, M. A. "Ambisonics in multichannel broadcasting and video," J. Audio Eng. Soc., vol. 33, No. 11, pp. 859-871, 1985.
Gerzon, M. A., "Periphony: With-height sound reproduction," J. Audio Eng. Soc., vol. 21, No. 1, pp. 2-10, 1973.
Gover, B. N., J. G. Ryan, and M. R. Stinson, "Microphone array measurement system for analysis of directional and spatial variations of sound fields.," J. Acoust. Soc. Am., vol. 112, No. 5 Pt 1, pp. 1980-1991, 2002.
Hafizovic, I., C.-I. C. Nilsen, M. Kjølerbakken, and V. Jahr, "Design and implementation of a MEMS microphone array system for real-time speech acquisition," Appl. Acoust., vol. 73, pp. 132-143, 2012.
Hamasaki, K., T. Nishiguchi, R. Okumura, Y. Nakayama, and A. Ando, "A 22.2 multichannel sound system for ultrahigh-definition TV," SMPTE Motion Imaging J., vol. 117, No. 3, pp. 40-49, 2008.
Hoffman, F. M., and F. M. Fazi, "Theoretical Study of Acoustic Circular Arrays With Tangential Pressure Gradient Sensors," IEEE Trans. Audio, Speech Lang. Proc., vol. 23, No. 11, pp. 1762-1774, 2015.
Jin, C. T., N. Epain, and A. Parthy, "Design, optimization and evaluation of a dual-radius spherical microphone array," IEEE Trans. Audio, Speech Lang. Process., vol. 22, No. 1, pp. 193-204, 2014.
Käsbach, J., and S. Favrot, "Evaluation of a mixed-order planar and periphonic Ambisonics playback implementation," in Forum Acusticum, 2011.
Koyama, S., K. Furuya, Y. Hiwasaki, Y. Haneda, and Y. Suzuki, "Wave field reconstruction filtering in cylindrical harmonic domain for with-height recording and reproduction," IEEE Trans. Audio, Speech Lang. Process., vol. 22, No. 10, pp. 1546-1557, 2014.
Li, Z., R. Duraiswami, and L. S. Davis, "Recording and reproducing high order surround auditory scenes for mixed and augmented reality," in Proc Third IEEE and ACM Intl. Symp. on Mixed and Augmented Reality, 2004, pp. 240-249.
Marschall, M., and J. Chang, "Sound-field reconstruction performance of a mixed-order Ambisonics microphone array," in Proc. Intl. Cong. Acoustics (ICA), 2013.
Marschall, M., S. Favrot, and J. M. Buchholz, "Robustness of a mixed-order Ambisonics microphone array for sound field reproduction," in Audio Engineering Society 132nd Convention, 2012, pp. 1-11.
Mathews, C. P., and M. D. Zoltowski, "Eigenstructure technique for 2-D angle estimation with uniform circular arrays," IEEE Trans. Signal Proc., vol. 42, No. 9, pp. 2395-2407, 1994.

(56) References Cited

OTHER PUBLICATIONS

Meyer, J. "Beamforming for a circular microphone array mounted on spherically shaped objects," J. Acoust. Soc. Am., vol. 109, No. 1, pp. 185-193, 2001.
Meyer, J. and G. W. Elko, "Spherical harmonic modal beamforming for an augmented circular microphone array," in IEEE International Conference on Acoustics Speech and Signal Processing (ICASSP), 2008, pp. 5280-5283.
Parthy, A. N. Epain, A. van Schaik, and C. T. Jin, "Comparison of the measured and theoretical performance of a broadband circular microphone array," J. Acoust. Soc. Am., vol. 130, No. 6, pp. 3827-3837, 2011.
Parthy, A., C. T. Jin, and A. van Schaik, "Evaluation of a concentric rigid open spherical microphone array for sound reproduction," in Ambisonics Symposium, 2009.
Poletti, M. A. "A Unified Theory of Horizontal Holographic Sound Systems," J. Audio Eng. Soc., vol. 48, No. 12, pp. 1155-1182, Dec. 2000.
Poletti, M. A., "Three-dimensional surround sound systems based on spherical harmonics," J. Audio Eng. Soc., vol. 53, No. 11, pp. 1004-1025, 2005.
Poletti, M. A., T. Betlehem, and T. D. Abhayapala, "Analysis of 2D sound reproduction with fixed-directivity loudspeakers," in Intl. Conf. Acoust. Speech Sig. Proc. ICASSP2012, 2012.
Poletti, M. A., T. Betlehem, and T. D. Abhayapala, "Higher order loudspeakers and active compensation for improved 2D sound field reproduction in rooms," J. Audio Eng. Soc., vol. 63, No. 1/2, pp. 31-45, 2015.
Pulkki, V. "Virtual Sound Source Positioning Using Vector Base Amplitude Panning," J. Audio Eng. Soc., vol. 45, No. 6, pp. 456-466, 1997.
Rafaely, B. "The spherical-shell microphone array," IEEE Trans. Audio, Speech Lang. Proc., vol. 16, No. 4, pp. 740-747, 2008.
Rafaely, B., "Analysis and design of spherical microphone arrays," IEEE Trans. Speech Audio Process., vol. 13, No. 1, pp. 135-143, 2005.
Sakamoto, S., S. Hongo, T. Okamoto, Y. Iwaya, and Y. Suzuki, "Sound-space recording and binaural presentation system based on a 252-channel microphone array," J. Acoust. Soc. Japan, vol. 36, No. 6, pp. 516-526, 2015.
Samarasinghe, P. N., T. D. Abhayapala, and M. A. Poletti, "Wavefield Analysis Over Large Areas Using Distributed Higher Order Microphones," IEEE Trans. Audio, Speech Lang. Proc., vol. 22, No. 3, pp. 647-658, 2014.
Teal, P. D. and M. A. Poletti, "Adaptive phase calibration of a microphone array for acoustic holography.," J. Acoust. Soc. Am., vol. 127, No. 4, pp. 2368-2376, 2010.
Teutsch, H., and W. Kellermann, "Acoustic source detection and localization based on wavefield decomposition using circular microphone arrays," J. Acoust. Soc. Am., vol. 120, No. 5, pp. 2724-2736, 2006.
Tiana-Roig, E., F. Jacobsen, and E. F. Grande, "Beamforming with a circular microphone array for localization of environmental noise sources.," J. Acoust. Soc. Am., vol. 128, No. 6, pp. 3535-3542, 2010.
Travis, C., "A New Mixed-Order Scheme for Ambisonic Signals," Int. Symp. Ambisonics Spherical Acoust., pp. 1-6, 2009.
Trevino, J., S. Koyama, S. Sakamoto, and Y. Suzuki, "Mixed-order ambisonics encoding of cylindrical microphone array signals," Acoust. Sci. Tech., vol. 35, No. 3, pp. 174-177, 2014.
Ward, D. B. and T. D. Abhayapala, "Reproduction of a plane-wave sound field using an array of loudspeakers," IEEE Trans. Speech Audio Process., vol. 9, No. 6, pp. 697-707, 2001.
Ward, D. B., R. A. Kennedy, and R. C. Williamson, "Theory and design of broadband sensor arrays with frequency invariant far-field beam patterns," J. Acoust. Soc. Am., vol. 97, No. 2, pp. 1023-1034, 1995.
Yan, S. "Optimal design of modal beamformers for circular arrays," J. Acoust. Soc. Am., vol. 138, No. 4, pp. 2140-2151, 2015.
Zotkin, D. N., R. Duraiswami, and N. A. Gumerov, "Plane-wave decomposition of acoustical scenes via spherical and cylindrical microphone arrays," IEEE Trans. Audio, Speech Lang. Proc., vol. 18, No. 1, pp. 2-16, 2010.
International Search Report and the Written Opinion from PCT Application No. PCT/US2016/069229, dated Mar. 9, 2017, 16 pages.
"Understanding Cabinet Diffraction", Audioblog (http://www.salksound.com/wp/?p=160), May 11, 2010, 10 pages.
Lopez, "A Formulation of Ambisonics in Unconventional Geometrics", Mar. 1, 2014, pp. 1-158.

* cited by examiner

CYLINDRICAL MICROPHONE ARRAY FOR EFFICIENT RECORDING OF 3D SOUND FIELDS

BACKGROUND

At a high level, sound can be described using different coordinate systems. For example, a Cartesian coordinate system (e.g., x, y, and z coordinates), or a spherical coordinate system (e.g., two angles, one angle with a vertical axis, and a rotational x-angle and a radius) may be used. There is also a cylindrical coordinate system, which can be thought of as something of a combination of Cartesian and spherical coordinate systems.

Conventional approaches to surround sound are typically based on spherical coordinates, and utilize a spherical microphone to record the sound. However, most users who listen to surround sound do not use a spherical loudspeaker system to reproduce the sound, and even if they did, such a system would require a large number of loudspeakers in order to work well without spatial aliasing. In addition, the spherical microphone that would be used would require a vast number of spherical harmonics to describe the sound field in both the elevational plane as well as the horizontal plane with sufficient resolution for the loudspeaker array (it should be noted that with a small speaker array, only a correspondingly small number of spherical harmonics signals can be used with it).

Stereophonic audio reproduction allows for sound to be created from any angle between two loudspeakers. However, stereophonic reproduction cannot produce sound arrivals from outside the angle subtended by the two loudspeakers.

Surround sound systems aim to provide users with a more immersive experience of sound by enabling the creation of sound waves arriving from all directions around a listener. Two-dimensional (2D) systems can generate sound waves in a horizontal plane arriving from angles over 360 degrees, and three-dimensional (3D) arrays can additionally generate sound waves arriving from elevations above the listener (and from below the listener in special purpose reproduction rooms such as anechoic chambers).

Surround sound reproduction systems typically consist of L loudspeakers in a 2D or 3D array. For example, a common format is to have L=5 loudspeakers in a circular array around the listener. The loudspeakers are positioned with a center loudspeaker in front of the listener, a left and right loudspeaker at +/−30 degrees on either side, and a pair of rear surround loudspeakers at +/−110 degrees.

Often, the sound signals for the loudspeakers are directly generated in a recording studio, where a large number of audio "tracks"—obtained, for example, from electronic sound devices or from recorded instruments—are available. Using existing principles of surround sound reproduction, it is possible to position sound at any angle, including angles between the loudspeakers, in a manner similar to the stereophonic case. This positioning (often referred to as "panning") is done for a surround system with L loudspeakers, with a known geometry, and for a given audio signal track, by amplitude weighting the audio track with L different amplitude weightings and feeding the resulting L weighted audio signals to all L loudspeakers.

In some cases, "pairwise panning" may be implemented, where an audio signal is sent to only two loudspeakers in a similar manner to stereo, to create a source position between the two loudspeakers. A general approach to achieving this is vector-based amplitude panning. Other modifications to the audio signals may also be made, such as filtering, which is understood by those skilled in the art to improve the quality of the reproduced signal. The net result of this mixing operation is a set of L loudspeaker signals that are played by the loudspeakers, positioned in the required geometry, to produce the desired sound field.

In some instances, the audio tracks that are panned are obtained from live recordings using multiple microphones. For example, a microphone may be placed in close proximity to each instrument being played so as to capture the audio signals produced by that individual instrument.

In other scenarios, surround sound systems may be used to reproduce a live recording that has been recorded using a single microphone system that attempts to reproduce the spatial sound field around a single listener. In this case, the recording microphone must capture the spatial attributes of the sound field with sufficient detail to allow the surround sound reproduction system to recreate the sound field. A technique that is often used for the recreation of a sound field in this manner is Higher Order Ambisonics (HOA). HOA decomposes the sound field recorded using a microphone system into a set of signals that are obtained from the description of the sound field in (typically) spherical coordinates, and which allow reproduction of the sound field using an arbitrary geometry and number of loudspeakers. An equivalent method is Wave Field Synthesis, in which the sound pressure and normal component of the velocity on the surface of a volume of space allow the reproduction of the sound field within that volume of space.

An alternative approach to the physical-based methods described above is perception-based methods, in which only those spatial cues that are perceptually relevant are recorded. Such methods include, for example, Dirac, Binaural Cue Coding, and methods employed in MPEG surround encoding.

The microphone for recording the sound field may have multiple outputs, each of which represents a component of the spatial sound field. These components are often termed cylindrical or spherical modes of the sound field. One of the earliest existing surround sound microphones produced four audio outputs, representing the sound pressure and the three components of the sound velocity. These signals were obtained from a compact coincident array of four pressure capsules in a tetrahedral configuration. More recently, higher-order surround sound microphone systems have been constructed using circular or spherical arrays of pressure microphones, typically mounted on a solid or open spherical or cylindrical baffle.

Circular arrays of transducers have been used to determine direction of arrival. Open circular arrays of directional microphones, where there is no cylindrical baffle, have been specifically applied to sound field recording. Open arrays of directional microphones have also proven to be useful for sound field decomposition, mainly because they eliminate or reduce zeros in the response that occurs with open arrays of pressure microphones. Other approaches have proposed the use of multiple circular arrays spaced along the z-axis, open arrays where each element is itself a higher-order microphone capable of producing multiple directional outputs, and circular arrays mounted on spherical baffles.

Most existing microphone arrays use conventional microphone elements that are based on capacitive or inductive transduction principles. More recently, micro-electro-mechanical systems (MEMS) have been developed, which implement small transducers in silicon. These devices are typically low-cost and small in size and are typically used in mobile phones. Arrays of MEMs microphones have been applied to the design of arrays for localization of sound. In some cases, these devices have on-board analogue to digital convertors and produce a single bit (sigma delta or pulse density modulation) output. In some cases the output is a serial representation of a pulse code modulation (PCM) representation of the analogue signal. Such devices are well-suited to the construction of large arrays where the outputs can be directly interfaced to digital processors without the need for a large number of external analog-to-digital convertors.

Spherical Harmonics Decomposition of 3D Sound Fields

The standard format for HOA is based on the use of spherical harmonics. The sound pressure in spherical coordinates at positive harmonic radian frequency ω can be expressed as $$p(r, \theta, \phi, \omega) = \sum_{n=0}^{\infty} \sum_{m=-n}^{n} j_n(kr) A_n^m(k) Y_n^m(\theta, \phi) \tag{1}$$

where $$Y_n^m(\theta, \phi) = \sqrt{\frac{(2n+1)}{4\pi} \frac{(n-|m|)!}{(n+|m|)!}} \, P_n^{|m|}(\cos\theta) e^{im\phi} \tag{2}$$

is the (n, m)th normalized complex spherical harmonic.

An alternative description to equation (1) is based on the plane wave expansion of sound fields. A general solution to the wave equation is given by the Herglotz distribution $$p(r, \theta, \phi, k) = \frac{1}{4\pi} \int_0^{\pi} \int_0^{2\pi} \Psi(\theta_i, \phi_i) e^{i\vec{k}\cdot\vec{r}} \sin\theta_i d\theta_i d\phi_i \tag{3}$$

The expansion of the plane wave term is $$e^{i\vec{k}\cdot\vec{r}} = 4\pi \sum_{n=0}^{\infty} \sum_{m=-n}^{n} i^n j_n(kr) Y_n^m(\theta, \phi) Y_n^m(\theta_i, \phi_i)^* \tag{4}$$

Furthermore, the plane wave amplitude function can be expanded in terms of spherical harmonics as $$\Psi(\theta_i, \phi_i) = \sum_{n=0}^{\infty} \sum_{m=-n}^{n} B_n^m(k) Y_n^m(\theta_i, \phi_i) \tag{5}$$

Substituting the expressions shown in equations (4) and (5) into equation (3) yields the plane wave expansion $$p(r, \theta, \phi) = \sum_{n=0}^{\infty} \sum_{m=-n}^{n} i^n B_n^m(k) j_n(kr) Y_n^m(\theta, \phi) \tag{6}$$

which is the same as equation (1), where $$A_n^m(k) = i^n B_n^m(k) \tag{7}$$

Thus, the plane wave coefficients as typically used in Ambisonics can be simply converted to the general coefficients in equation (1), and vice versa.

In Ambisonics, the sound field in equation (6) is described in terms of real spherical harmonics obtained from the real and imaginary parts of equation (2). Following the terminology in the 2D case, the complex spherical harmonics may be termed "phase modes" and the real spherical harmonics may be termed "amplitude modes." It should be understood by those skilled in the art that the plane wave expansion (as shown in equation (6)) is equivalent to equation (1). Further, it should also be understood by those skilled in the art that other expansions in terms of real spherical harmonics may also be equivalent, and that the various conclusions presented in detail herein may apply equally to these other descriptions.

The coefficients in equation (1) can be determined using, for example, a solid spherical baffle or a continuous distribution of directional (e.g., outward facing) microphones (typically cardioid). The complex sound pressure on the surface of an open or rigid sphere, with the incident field from equation (1), has the generic form $$p_S(R, \theta, \phi, k) = \sum_{n=0}^{\infty} \sum_{m=-n}^{n} b_n(ka) A_n^m(k) Y_n^m(\theta, \phi) \tag{8}$$

where, for example, $$b_n(ka) = \begin{cases} \frac{-i}{(ka)^2 h_n'(ka)}, & \text{rigid sphere} \\ j_n(ka) - i j_n'(ka), & \text{open cardioid sphere} \end{cases} \tag{9}$$

where $h_n(.)$ is the spherical Hankel function of the second kind (it should be noted that other arrays will produce other $b_n$ functions). The sound field coefficients are preferably obtained by multiplying $p_S(a,\theta,\phi,k)$ by a desired spherical harmonic function and integrating over the sphere $$A_n^m(k) = \frac{1}{4\pi b_n(ka)} \int_0^{\pi} \int_0^{2\pi} p_S(a, \theta, \phi, k) Y_n^m(\theta, \phi)^* \sin\theta d\theta d\phi \tag{10}$$

The summation in equation (1) can be limited to a maximum order $N \approx \lceil kr \rceil$ for a given maximum radius r and maximum wave number k, where $\lceil . \rceil$ denotes rounding up to the nearest integer. In this case, there are a total of $(N+1)^2$ terms in the expansion of the sound field. Each term corresponds to an audio signal $a_n^m(t)$ that represents the frequency-dependent expansion term $A_n^m(k)$ in the time domain. Hence, there are a total of $(N+1)^2$ audio signals required to represent the Nth-order approximation of the sound field.

Discrete Spherical Arrays

In practice, spherical arrays are implemented using a discrete array of M microphone elements. The design of spherical arrays involves the selection of a sphere of sufficient size to record the sound field, the selection of a number of microphone elements, M, and a sampling scheme to position these microphones on the surface of the sphere such that the spherical harmonics can be generated by a discrete approximation with sufficient accuracy. Typically, the number of microphones must be greater than $(N+1)^2$ and must be placed regularly over the whole surface of the sphere to minimize the error in estimating the spherical harmonic coefficients up to order N.

A consequence of the discrete array is that the sound pressure on the sphere cannot be unambiguously determined for frequencies where the microphones are greater than half a wavelength apart. There is thus a maximum frequency where the array can operate correctly, known as the spatial aliasing frequency or—following the equivalent sampling theorem for 1D signals—the spatial Nyquist frequency. The aliasing frequency can be approximately determined for a sphere as follows. If the sphere has radius a then the surface area is $4\pi a^2$. The approximate spacing between microphones for a uniform geometry is then $2a\sqrt{\pi/M}$ and the spatial Nyquist frequency is $$f_{Nyq3} \approx \frac{c}{4a}\sqrt{\frac{M}{\pi}} \qquad (11)$$

For example, an array of M=32 microphones on a sphere of radius 0.1 meters (m) produces a spatial Nyquist frequency of 2.7 kHz. A spatial Nyquist frequency of 8 kHz requires M=275 microphones. Hence, large numbers of microphones are required to produce high spatial Nyquist frequencies. This means that the construction of spherical arrays with sufficient size for recording 3D fields over audio frequency ranges is challenging.

Spherical Harmonics Decomposition of 2D Sound Fields

Most surround sound reproduction systems are 2D and produce a desired sound field in the horizontal plane. This is simpler and more practical than the installation of 3D arrays. Furthermore, it has been shown that human spatial acuity is greatest for sound sources in the horizontal plane. In some instances, reproduction arrays are used which provide capability for producing elevational cues. The recording and reproduction of 2D sound fields, or sound fields with greater accuracy in the horizontal plane, can therefore produce more efficient and perceptually relevant results.

Spherical harmonics can be used to record and reproduce 2D sound fields. It has been shown that the sectorial spherical harmonics, for which n=|m| and which have significant magnitudes only in the horizontal plane, are sufficient to allow reproduction of the sound pressure in the horizontal plane. The fraction of the total audio signals used for 2D sound recording and reproduction (e.g., using the 2.5D approach) is $(2N+1)/(N+1)^2$, which is illustrated in the graphical representation 100 of FIG. 1.

It is clear from representation 100 that as the order of the recorded sound field increases, the sectorial components become a small fraction (percentage) of the total audio channels. For example, $10^{th}$ order sound fields use 21 sectorial signals to represent the horizontal plane and a further 100 channels to include elevational information. When the sound reproduction system is a 2D array, this means that 83% of the audio signals are unnecessary.

Spherical harmonics can also be used to record and reproduce sound fields with greater resolution in the horizontal plane and limited resolution in elevation. These "mixed-order Ambisonics" approaches record a high order of sectorial harmonics but a restricted subset of the non-sectorial harmonics.

Mixed-order Ambisonics typically use rigid spherical microphone arrays and the determination of a transducer layout that allows a given set of mixed-order spherical harmonics to be determined with minimal error.

One existing approach uses a cylindrical microphone with the cylinder axis oriented along the horizontal x-axis. The cylinder has multiple circular arrays that allow a cylindrical decomposition of the sound field where the resolution in elevation is governed by the number of microphones in each ring and the resolution in azimuth is governed by the number of rings and the spacing between them. Since the number of rings can be set independently from the number of microphones per ring, the azimuth and elevation resolutions may be independently controlled.

SUMMARY

This Summary introduces a selection of concepts in a simplified form in order to provide a basic understanding of some aspects of the present disclosure. This Summary is not an extensive overview of the disclosure, and is not intended to identify key or critical elements of the disclosure or to delineate the scope of the disclosure. This Summary merely presents some of the concepts of the disclosure as a prelude to the Detailed Description provided below.

The present disclosure generally relates to audio signal processing. More specifically, aspects of the present disclosure relate to spatial audio recording using a cylindrical microphone array.

One embodiment of the present disclosure relates to an apparatus for recording a three-dimensional sound field, the apparatus comprising: a cylindrical baffle; and a plurality of line arrays distributed around a circumference of the cylindrical baffle, each line array including microphone elements spaced apart from one another in a longitudinal direction of the cylindrical baffle, where each of the line arrays produces a set of vertical beamformer responses, the set of responses having a maximum response at a specified direction of arrival and specified elevation.

In another embodiment, the cylindrical baffle of the apparatus has at least one rounded end to control diffraction effects.

In another embodiment, the apparatus for recording a three-dimensional sound field includes one or more vertical beamformers to reduce diffraction effects at one or both ends of the cylindrical baffle.

In yet another embodiment, the plurality of line arrays of the apparatus are positioned at regularly-spaced angles around the circumference of the cylindrical baffle.

In still another embodiment, the microphone elements of each line array of the apparatus are equally spaced apart from one another in the longitudinal direction of the cylindrical baffle.

In yet another embodiment, the microphone elements of each line array of the apparatus are nonlinearly spaced apart from one another in the longitudinal direction of the cylindrical baffle such that a distance between adjacent microphone elements increases towards one or both ends of the array.

Another embodiment of the present disclosure relates to a method for recording a three-dimensional sound field, the method comprising: receiving, at a plurality of vertical beamformers of a cylinder-shaped audio recording device, plane waves arriving at a specified elevation angle; and generating, based on a decomposition in azimuth of the plane waves arriving at the specified elevation angle, cylindrical coefficients for the elevation angle.

In another embodiment, the method for recording a three-dimensional sound field further comprises generating azimuthal mode decompositions; and applying a mode equalizer to each of the azimuthal mode decompositions.

In another embodiment, generating the azimuthal mode decompositions in the method for recording a three-dimensional sound field includes assigning weights to a set of vertically beamformed outputs associated with the specified elevation; and combining the weighted outputs to produce the azimuthal mode decompositions.

Yet another embodiment of the present disclosure relates to a system for recording a three-dimensional sound field, the system comprising system memory, at least one processor coupled to the system memory, and a non-transitory computer-readable medium associated with the at least one processor, the non-transitory medium having instructions stored thereon that, when executed by the at least one processor, causes the at least one processor to: select plane waves arriving at a specified elevation angle at a plurality of vertical beamformers of a cylinder-shaped audio recording device, and generate, based on a decomposition in azimuth of the plane waves arriving at the specified elevation angle, cylindrical coefficients for the elevation angle.

In another embodiment, the at least one processor of the system for recording a three-dimensional sound field is caused to: generate azimuthal mode decompositions; and apply a mode equalizer to each of the azimuthal mode decompositions.

In yet another embodiment, the at least one processor of the system for recording a three-dimensional sound field is caused to: assign weights to a set of vertically beamformed outputs associated with the specified elevation; and combine the weighted outputs to produce the azimuthal mode decompositions.

In one or more other embodiments, the methods, systems, and apparatuses described herein may optionally include one or more of the following additional features: each set of vertical beamformer responses is processed in azimuth to produce cylindrical coefficients of the sound field at the specified elevation; each microphone element is a microelectro-mechanical system (MEMS) microphone; the mode equalizer applied to each of the azimuthal mode decompositions is specific to the azimuthal order and specified elevation; the plurality of vertical beamformers are configured to represent elevational information in the sound field for a specified reproduction loudspeaker array; and/or the plurality of vertical beamformers are configured to represent elevational information in the sound field for a prescribed maximum subjective resolution of sound in elevation.

It should be noted that embodiments of some or all of the processor and memory systems disclosed herein may also be configured to perform some or all of the method embodiments disclosed above. In addition, embodiments of some or all of the methods disclosed above may also be represented as instructions and/or information embodied on transitory or non-transitory processor-readable storage media such as optical or magnetic memory or represented as a propagated signal provided to a processor or data processing device via a communication network such as, for example, an Internet or telephone connection.

Further scope of applicability of the methods, systems, and apparatuses of the present disclosure will become apparent from the Detailed Description given below. However, it should be understood that the Detailed Description and specific examples, while indicating embodiments of the methods, systems, and apparatuses, are given by way of illustration only, since various changes and modifications within the spirit and scope of the concepts disclosed herein will become apparent to those skilled in the art from this Detailed Description.

BRIEF DESCRIPTION OF DRAWINGS

These and other objects, features, and characteristics of the present disclosure will become more apparent to those skilled in the art from a study of the following Detailed Description in conjunction with the appended claims and drawings, all of which form a part of this specification. In the drawings:

Figure 1:
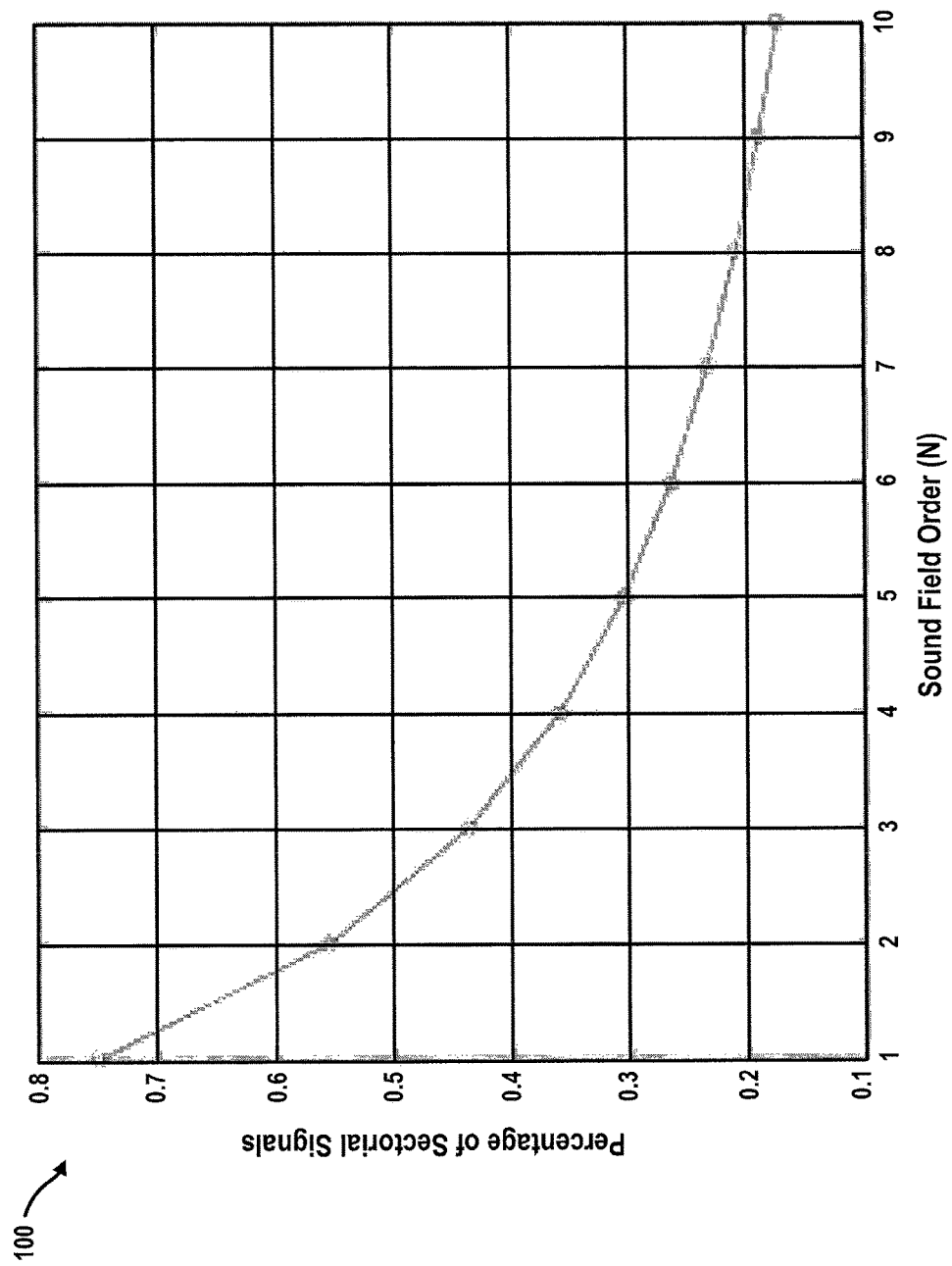
FIG. 1 is a graphical representation illustrating the fraction of spherical harmonics that are sectorial.

The headings provided herein are for convenience only and do not necessarily affect the scope or meaning of what is claimed in the present disclosure.

In the drawings, the same reference numerals and any acronyms identify elements or acts with the same or similar structure or functionality for ease of understanding and convenience. The drawings will be described in detail in the course of the following Detailed Description.

DETAILED DESCRIPTION

Various examples and embodiments of the methods, systems, and apparatuses of the present disclosure will now be described. The following description provides specific details for a thorough understanding and enabling description of these examples. One skilled in the relevant art will understand, however, that one or more embodiments described herein may be practiced without many of these details. Likewise, one skilled in the relevant art will also understand that one or more embodiments of the present disclosure can include other features not described in detail herein. Additionally, some well-known structures or functions may not be shown or described in detail below, so as to avoid unnecessarily obscuring the relevant description.

As described above, existing approaches for spatial audio recording are either limited in their capabilities (e.g., unable to perform beamforming in elevation) or are impractical for many applications. Whereas some of the existing approaches described above are considered perception-based methods, in which only those spatial cues that are perceptually relevant are recorded, the present disclosure relates to the physical-based higher-order Ambisonics method of recording and reproducing spatial sound.

In view of the various limitations of existing approaches for spatial audio recording, embodiments of the present disclosure relate to methods, systems, and apparatuses for recording 3D sound fields using a vertically-oriented cylindrical array with multiple circular arrays at different heights. The techniques and designs described herein are well-suited to providing a high resolution in azimuth and a reduced resolution in elevation, and offer improved performance over existing 3D sound reproduction systems, which typically only have loudspeakers at two or three heights. The present disclosure provides an alternative format to the mixed-order spherical decomposition, and allows for less complex and less costly manufacture as compared with spherical arrays.

For example, one or more embodiments involves the use of low-cost silicon microphones that provide digital outputs and which can be easily interfaced to a digital processor, and subsequently to a digital storage device, without requiring a large number of analogue to digital convertors. One advantage of the methods, systems, and apparatuses described herein is that they provide a larger vertical aperture than horizontal aperture, as opposed to a spherical array, which has the same aperture for all dimensions. This is particularly relevant to loudspeaker reproduction arrays consisting of multiple rings (e.g., three) where the vertical spacing between rings is relatively small, requires a high resolution decomposition of the sound field in elevation, but with a small number of desired directions (e.g., three).

Figure 2:
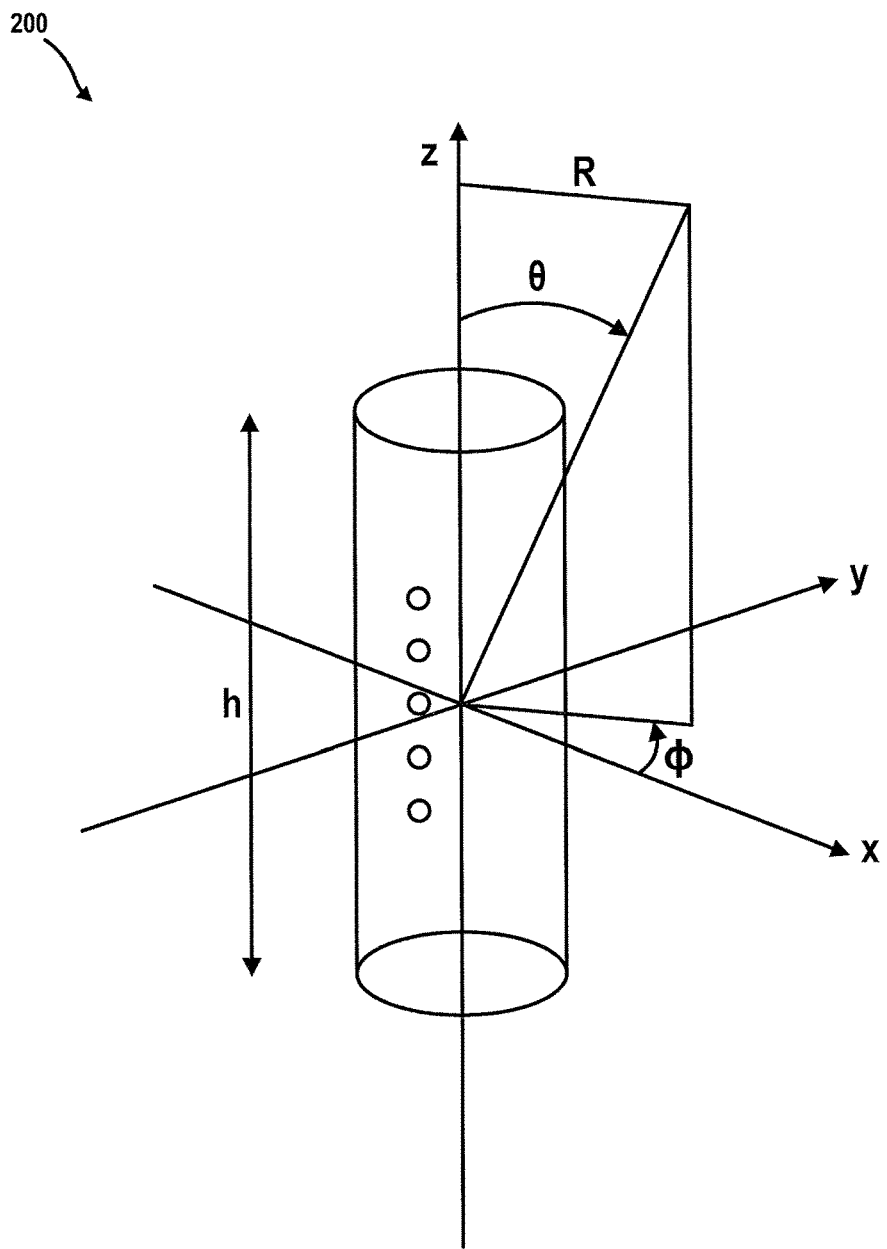
FIG. 2 is a schematic diagram illustrating cylindrical coordinates and finite height cylinder geometry according to one or more embodiments described herein.

FIG. 2 illustrates cylindrical coordinates and finite height cylinder geometry 200. In accordance with at least one embodiment of the present disclosure, the solution to the wave equation in cylindrical coordinates $(R,\phi,z)$ (e.g., as shown in FIG. 2) within a region of space devoid of sources (e.g., the "interior solution") has the plane-wave form (the cylindrical equivalent of equation (6), obtained from an equivalent cylindrical Herglotz distribution):

$$p(R, \phi, z, \omega) = \sum_{m=-\infty}^{\infty} e^{im\phi} \frac{1}{2\pi} \int_{-\infty}^{\infty} i^m B_m(k_z, \omega) J_m(k_R R) e^{ik_z z} dk_z \quad (12)$$

where $J_m(.)$ is the cylindrical Bessel function, $B_m(k_z,\omega)$ is the mth sound field expansion function, $k_z$ is the z-component of the vector wave number, and $k_R = \sqrt{k^2 - k_z^2}$. The cylindrical description has a trigonometric expansion in azimuthal angle, but a continuous distribution in $k_z$. The plane wave coefficients are then a continuous function of $k_z$.

For a finite wave number k and radius R, equation (12) may be truncated to a maximum order M≈⌈kR⌉ in a manner similar to that used in the spherical case.

For an incident field consisting of plane waves arriving from an angle $\theta_i$ from the z-axis, $k_z = k \cos \theta_i$ and $k_R = k \sin \theta_i$. The integral in equation (12) can be transformed by the substitution $k_z = k \cos \theta_i$ into $$p(R, \phi, z, \omega) = \sum_{m=-\infty}^{\infty} e^{im\phi} \frac{1}{2\pi} \int_0^{\pi} i^m B_m(\theta, \omega) J_m(kR \sin \theta) e^{ikz \cos \theta} \sin\theta d\theta \quad (13)$$

For an incident field consisting of plane waves arriving solely from an angle $\theta_i$ from the z-axis the sound pressure (equation (13)) simplifies to $$p(R, z, \phi, \omega) = e^{-ikz \cos \theta_i} \sum_{m=-\infty}^{\infty} e^{im\phi} i^m B_m(\theta_i, \omega) J_m(kR \sin \theta_i) \quad (14)$$

If the incidence angle is $\theta_i = \pi/2$, then the plane wave distribution is z-independent and $$p(R, \phi, \omega) = \sum_{m=-M}^{M} e^{im\phi} i^m B_m(\omega) J_m(kR) \quad (15)$$

which is the solution to the wave equation for a 2D sound field in a source-free region, with coefficients $i^m B_m(\omega)$.

The cylindrical decomposition of the sound field can be expressed in terms of amplitude modes in a similar manner to the spherical decomposition. Combining the negative and positive m terms in equation (13) gives $$p(R, \phi, z, \omega) = \frac{1}{2\pi} \int_0^{\pi} C_0(\theta, \omega) J_0(kR \sin \theta) e^{ikz\cos\theta} \sin\theta d\theta + \quad (16)$$
$$\frac{1}{2\pi} \sum_{m=1}^{\infty} \int_0^{\pi} i^m [C_m(\theta, \omega) \cos m\phi + D_m(\theta, \omega) \sin m\phi]$$
$$J_m(kR \sin \theta) e^{ikz\cos\theta} \sin\theta d\theta$$

where $C_0(\theta,\omega) = B_0(\theta,\omega)$ and $$C_m(\theta,\omega) = B_m(\theta,\omega) + B_{-m}(\theta,\omega) \quad (17)$$

$$D_m(\theta,\omega) = i(B_m(\theta,\omega) - B_{-m}(\theta,\omega)) \quad (18)$$

For plane waves at elevation $\theta_i$ the amplitude mode expansion simplifies to (following equation (14))

$$p(R, \phi, \theta_i, \omega) = C_0(\theta_i, \omega) J_0(kR \sin \theta_i) e^{ikz\cos\theta_i} + \quad (19)$$
$$\sum_{m=1}^{\infty} i^m [C_m(\theta_i, \omega) \cos m\phi + D_m(\theta_i, \omega) \sin m\phi] J_m(kR \sin \theta_i) e^{ikz\cos\theta_i}$$

Equation (19) provides an alternative approach to the recording of 3D sound fields using spherical harmonics in which the resolution of the sound field in elevation may be chosen independently of the azimuthal resolution. The field components can be determined for a set of Q angles $\theta_q$, each of which has an expansion of the form of equation (19).

Figure 3:
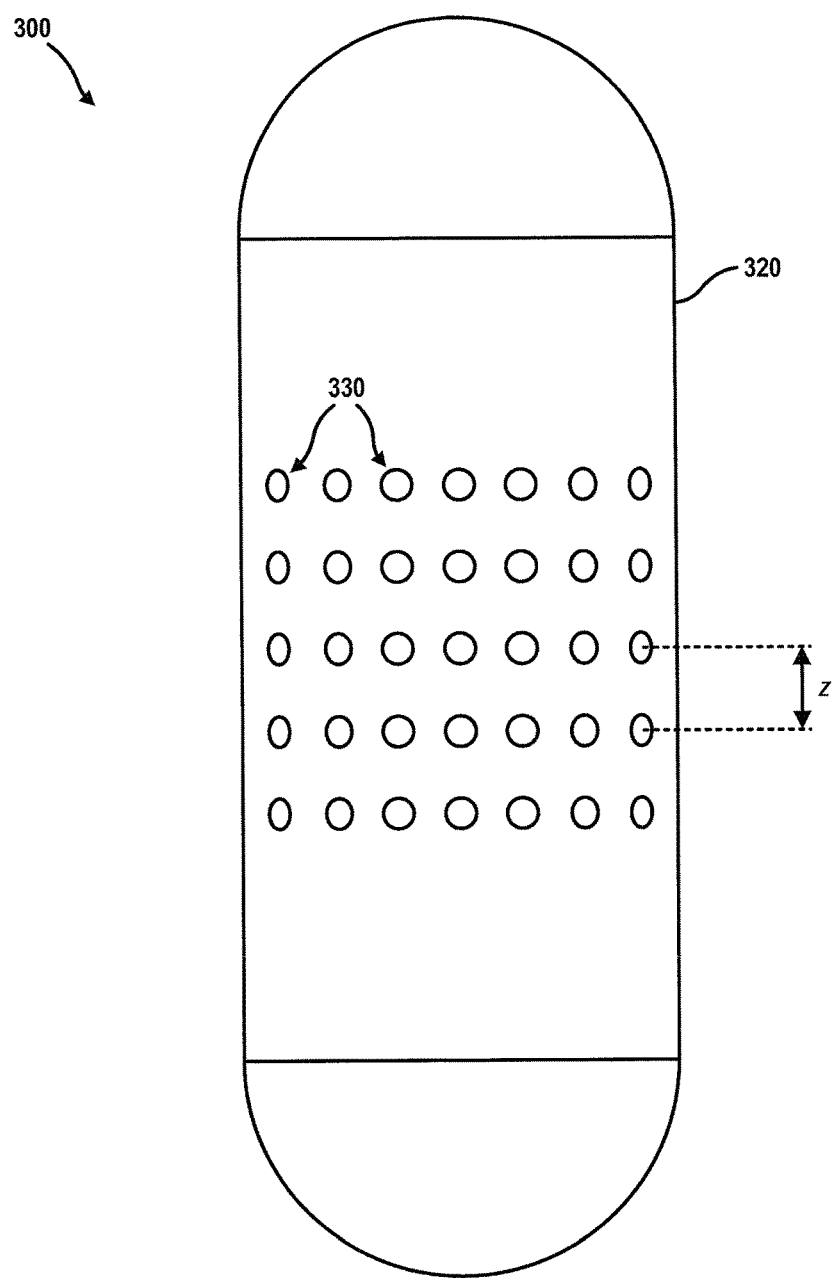
FIG. 3 is a schematic diagram illustrating an example cylindrical microphone array with line array microphone elements regularly spaced apart according to one or more embodiments described herein.

In accordance with one or more embodiments described herein, the elevational decomposition may be carried out using a cylindrical microphone array consisting of a set of vertical line arrays placed around a cylinder (e.g., vertical line arrays 330 distributed around the circumference of cylindrical baffle 320 as shown in FIG. 3, which will be described in greater detail below). In practice, the cylinder may have a finite height and one or both ends of the cylinder may be rounded to control the diffraction effects at the edges.

For example, in accordance with at least one embodiment, the rounded ends (or end) of the cylinder may be hemispherical so that there is a smooth transition from the sides of the cylinder to the rounded ends, to minimize diffraction from the junction of the two. However, for a more compact implementation, one or both of the rounded ends may be flatter. It should be noted that, in most implementations, both ends of the cylinder should have rounded ends since high-order diffraction from either top or bottom can affect the mode responses of the array.

In order to record sound fields for listening by a single listener, the cylinder diameter should be, in accordance with at least one embodiment, of a size similar to, or greater than, the human head. If the diameter of the cylinder is equal to the mean human head diameter, then pairs of microphone signals from opposite sides of the array can provide an approximation to binaural recordings, which provides an alternative use of the microphone. The cylinder height should be sufficiently large so that the microphone arrays are not significantly affected by diffraction from either of the ends. For example, the cylinder may have a diameter of 180 mm and a height (including rounded ends) of 394 mm. As a second example, the cylinder diameter may be 175 mm and the cylinder height may be 450 mm. In practice, where a very compact microphone is required, the mode responses of the array will differ from the theoretical values that assume an infinite height cylinder, and in this case must be determined numerically using acoustic simulation software which implements techniques such as, but not limited to, equivalent source methods, finite difference time domain methods, or boundary element methods.

The following describes recording sound fields in the format of equation (19) in accordance with one or more embodiments of the present disclosure. It should be noted that the following description is based on an initial assumption that the cylindrical microphone array has infinite height.

The sound pressure on a rigid cylinder of radius a and infinite height has the amplitude mode form $$p_C(a, \phi, z, \omega) = \frac{1}{2\pi} \int_0^\pi b_0(\theta, \omega) C_0(k \cos\theta, \omega) e^{ikz\cos\theta} d\theta + \frac{1}{2\pi} \sum_{m=1}^\infty \int_0^\pi b_m(\theta, \omega)[C_m(\theta, \omega)\cos m\phi + D_m(\theta, \omega)\sin m\phi] i^m e^{ikz\cos\theta} d\theta \quad (20)$$

where $$b_m(\theta, \omega) = \frac{-2i}{\pi a H'_m(ka\sin\theta)} \quad (21)$$

is the cylinder mode response.

The coefficients $C_m(\theta,\omega)$ and $D_m(\theta,\omega)$ can, in principle, be determined by multiplying the pressure (equation (20)) by $\exp(-ikz \cos \theta_i)$ and integrating over z $$p_C(a, \phi, \theta_i, \omega) = \int_{-\infty}^\infty p_C(a, \phi, z, \omega) e^{-ikz\cos\theta_i} dz \quad (22)$$
$$= b_0(\theta_i, \omega) C_0(\theta_i, \omega) + \sum_{m=1}^\infty b_m(\theta_i, \omega) i^m [C_m(\theta_i, \omega)\cos m\phi + D_m(\theta_i, \omega)\sin m\phi]$$

This selects only those components of the sound field consisting of plane waves with angle of elevation $\theta_i$.

It should be understood that, in practice, equation (22) may not be implemented since a finite number of samples of the pressure are available in z, obtained from a finite number of microphones. This limitation can be accounted for by including a general aperture weighting f(z), which may include delta functions to describe discrete arrays in z. The resulting integral over z is $$\tilde{p}_C(a, \phi, \theta_i, \omega) = \int_{-\infty}^\infty p_C(a, \phi, z, \omega) f(z) dz \quad (23)$$

-continued
$$= \frac{1}{2\pi} \int_{-\infty}^\infty b_0(\theta, \omega) C_0(\theta, \omega) F(\theta, \omega) \sin\theta d\theta + \frac{1}{2\pi} \sum_{m=1}^\infty \int_{-\infty}^\infty b_m(\theta, \omega) i^m [C_m(\theta, \omega)\cos m\phi + D_m(\theta, \omega)\sin m\phi] F(\theta, \omega) \sin\theta d\theta$$

where $$F(\theta, \omega) = \int_{-\infty}^\infty f(z) e^{-ikz\cos\theta} dz \quad (24)$$

is the vertical response produced by the integral over z at the radian frequency $\omega$. This expansion describes the output of a cylindrical microphone array which implements vertical beamforming (where beamforming refers to the design of a spatio-temporal filter that operates on the outputs of a microphone array). As understood by those skilled in the art, a beamformer is a signal processor used together with a microphone array to provide spatial filtering capabilities such as, for example, extracting a signal from a specific direction and reducing undesired interfering signals from other directions. The microphone array produces spatial samples of a propagating wave, which are then manipulated by the signal processor to produce the beamformer output signal. In at least one example, beamforming is accomplished by filtering the microphone signals and combining the outputs to extract (e.g., using constructive combining) the desired signal and reject (e.g., using destructive combining) interfering signals according to their spatial location. Depending on the particular arrangement, a beamformer can separate sources with overlapping frequency content that originate at different spatial locations. Typically, the beamforming filtering is accomplished by applying a delay to each microphone signal so that the microphone outputs are in phase for the desired location and correspondingly out of phase for other spatial locations. Amplitude weightings may also be applied to limit the effects of the finite array size and reduce side-lobes in the polar response of the beamformer. Returning to the output of the cylindrical microphone array that implements vertical beamforming, the output approximates the expansion in equation (22) if the beamformer is designed to respond primarily to $\theta=\theta_i$. The corresponding approximate sound field coefficients at the specified elevation can be found using the identities $$\frac{1}{\pi} \int_0^{2\pi} \cos(n\phi)\cos(m\phi) d\phi = \begin{cases} 2, n = m = 0 \\ \delta(n - m), n \neq 0 \end{cases} \quad (25)$$

$$\frac{1}{\pi} \int_0^{2\pi} \sin(n\phi)\sin(m\phi) d\phi = \begin{cases} 0, n = m = 0 \\ \delta(n - m), n \neq 0 \end{cases} \quad (26)$$

$$\frac{1}{\pi} \int_0^{2\pi} \cos(n\phi)\sin(m\phi) d\phi = 0 \quad (27)$$

as $$\tilde{C}_0(\theta_i) e^{i\omega t} = \frac{1}{b_0(\theta_i, \omega)} \int_0^{2\pi} \tilde{p}_C(a, \phi, \theta_i, \omega, t) d\phi \quad (28)$$

$$\tilde{C}_m(\theta_i) e^{i\omega t} = \frac{2i^{-m}}{b_m(\theta_i, \omega)} \int_0^{2\pi} \tilde{p}_C(a, \phi, \theta_i, \omega, t) \cos(m\phi) d\phi, m \in [0, M] \quad (29)$$

-continued $$\tilde{D}_m(\theta_i)e^{i\omega t} = \frac{2i^{-m}}{b_m(\theta_i, \omega)} \int_0^{2\pi} \tilde{p}_C(a, \phi, \theta_i, \omega, t)\sin(m\phi)d\phi, m \in [1, M] \quad (30)$$

A set of desired elevation angles $\theta_i=\theta_q$, q=1, . . . , Q can then be chosen (including the horizontal plane, $\theta_q=\pi/2$) to allow a 3D sound field to be represented as a horizontal field plus a finite number of elevational fields. The 3D field produces a sparse plane wave approximation to the full 3D field in elevation. In at least one embodiment, the number Q may be chosen to suit a reproduction array, which consists of loudspeakers at a finite number of elevational angles. In accordance with at least one other embodiment, the number Q may be chosen to best represent human acuity in elevation.

In practice, the mode response function $b_m(\theta_q,\omega)$ is small at low frequencies and for large m, and so the equalization may be implemented using a regularized inverse $$E_m(\theta_q, \omega) = \frac{b_m(\theta_q, \omega)^*}{\lambda + |b_m(\theta_q, \omega)|^2} \quad (31)$$

where $\lambda$ is a regularization parameter that prevents excessive gain at frequencies where $b_m(\theta_q,\omega)$ is small.

It should be noted that mode response $b_m(\theta_q,\omega)$ may not precisely equal equation (21), since the cylinder is not infinite in height. The effect of a finite cylindrical baffle is to produce additional variations in the mode response. The mode response variations are reduced by using rounded ends on the baffle. The effects of the finite length are further reduced by the vertical beamforming, which tends to attenuate sound arriving from the ends of the baffle.

In accordance with at least one embodiment, the decomposition of each elevational sound field in azimuth is carried out using $L_\phi$ microphones in azimuth. The cylindrical microphone array thus consists of $L_\phi$ line arrays equally spaced around the cylinder, with each line array having $L_z$ elements. There are thus a total of $L_M=L_\phi L_z$ microphones.

The spatial Nyquist frequency in azimuth is obtained from the inter-microphone spacing $2\pi a/L_\phi$ $$f_{Nyq,az} \approx \frac{cL_\phi}{4\pi a} \quad (32)$$

FIG. 3 illustrates a cylindrical microphone array 300 in accordance with one or more embodiments of the present disclosure. The cylindrical microphone array 300 includes a cylindrical baffle 320 with rounded ends (e.g., one or both ends may be rounded), with microphones positioned at $L_\phi$ angles around the circumference, preferably at regularly-spaced angles of the general form $\phi_v=2\pi v/L_\phi$, v=0, 1, . . . $L_\phi-1$. The cylindrical baffle 320 may be solid, hollow, or of some other form, as long as it presents infinite acoustic impedance to impinging waves. At each angle, $\phi_v$, a vertical line array 330 consisting of $L_z$ microphones is positioned. In accordance with at least one embodiment, the line array 330 microphone elements may be regularly spaced in height with inter-microphone spacing z. The spatial aliasing (e.g., half wavelength) frequency for beamforming in elevation is then $$f_{Nyq,el} = \frac{c}{2z} \quad (33)$$

Figure 4:
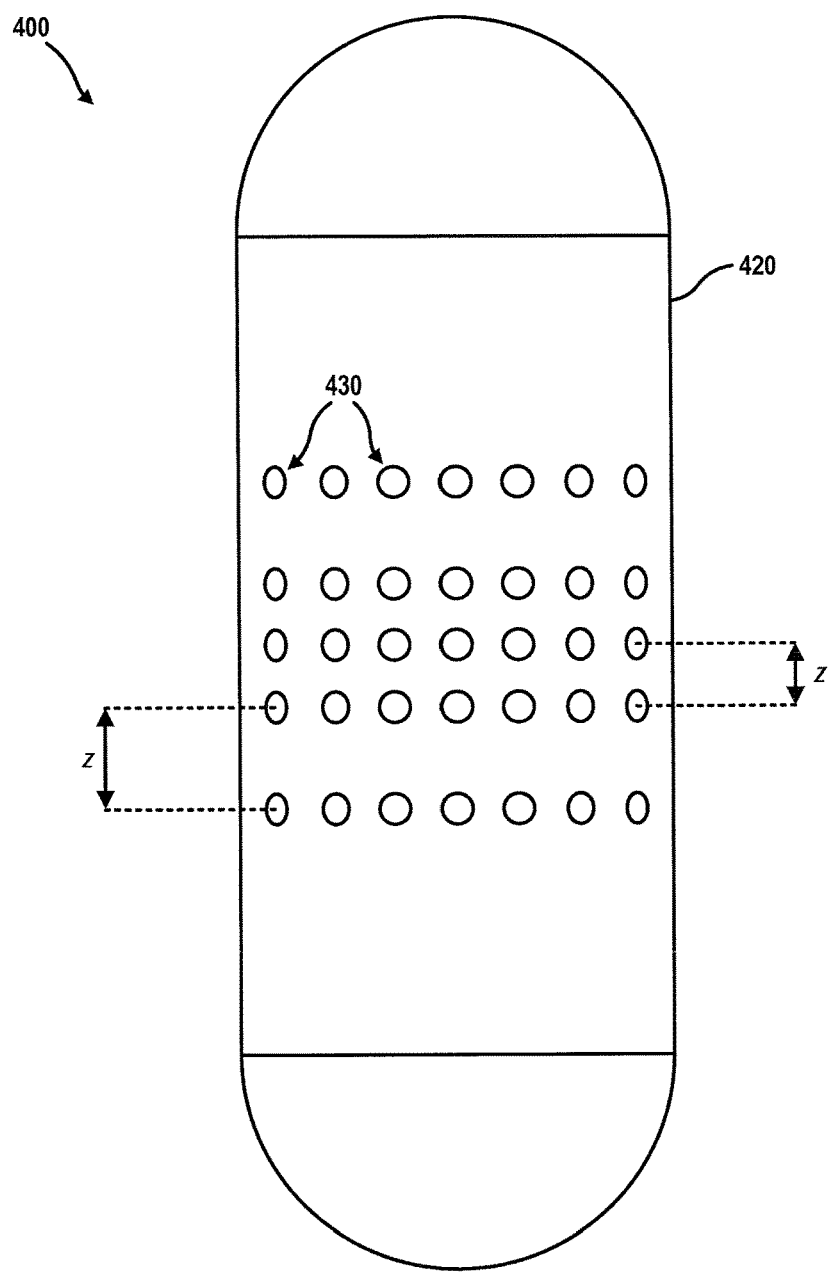
FIG. 4 is a schematic diagram illustrating an example cylindrical microphone array with line array microphone elements non-uniformly spaced apart according to one or more embodiments described herein.

FIG. 4 illustrates a cylindrical microphone array 400, including a cylindrical baffle 420 and vertical line arrays 430, in accordance with at least one other embodiment of the present disclosure. While cylindrical microphone array 400 is similar in form and function as cylindrical microphone array 300 (described above and shown in FIG. 3), in cylindrical microphone array 400 the vertical line arrays 430 are nonlinearly or non-uniformly spaced such that the distance between adjacent microphones (e.g., inter-microphone spacing z) increases towards one or both ends of the array, allowing a greater aperture to be achieved at low frequencies, which provides the maximum capability for frequency-invariant beamforming.

It should also be noted that, in accordance with at least one embodiment, the microphone elements positioned on the cylindrical baffle (e.g., cylindrical baffle 320 or 420 as shown in FIGS. 3 and 4, respectively) may not be aligned in the vertical dimension (e.g., not aligned in a vertical array). For example, one microphone element of an array may be misaligned (or off-center) in one direction, while the next microphone element of the array is misaligned to the same or similar extent in the opposing direction. It should be understood that the microphone elements may also be arranged or positioned on the cylindrical baffle in various other ways in addition to or instead of the example arrangements described above.

In at least one embodiment, the microphone has $L_\phi=32$ line arrays, and at each angle in azimuth there are $L_z=5$ microphones in elevation, at distances of, for example, ±20 and ±60 mm from the central microphone position.

Each microphone may be, for example, a MEMS microphone that has frequency response characteristics which are well-matched (e.g., typically within ±1 dB of each other). In accordance with at least one embodiment, each MEMS microphone may have a digital output that converts the analog output of the MEMS mechanism into a digital representation of the sound pressure. In accordance with at least one embodiment, two microphone data signals may optionally be multiplexed onto a single data line, so that the total number of data lines is $L_\phi L_z/2$. The data lines are connected to a central processor unit which processes the data. In the case of a sigma delta or pulse density modulation bit stream, the processor may down-sample and convert the bitstreams to a pulse code modulation (PCM) data format.

In at least one embodiment, the PCM data may be directly transmitted via a serial interface, such as, for example, an Ethernet connection, to a computing device that receives and stores the microphone signals. The computer may apply Q vertical beamformers to each line array, producing Q outputs for each line array which represent the sound arriving at the microphone from elevation angle $\theta_q$. The Q outputs are then further decomposed into 2M+1 azimuthal modes. Each mode has a mode equalizer (EQ) applied to produce the desired mixed-order Ambisonics representation.

In accordance with one or more other embodiments, the digital processor within the microphone array applies Q vertical beamformers to each line array producing Q outputs for each line array, each of which represent the sound arriving at the microphone from elevation angle $\theta_q$. The Q outputs are then further decomposed into 2M+1 azimuthal modes. Each mode has a mode equalizer applied to produce the desired mixed-order Ambisonics representation. The Q(2M+1) signals may then be transmitted via a serial interface, such as, for example, an Ethernet connection, to a computing device that receives and stores the elevational Ambisonics signals.

Figure 5:
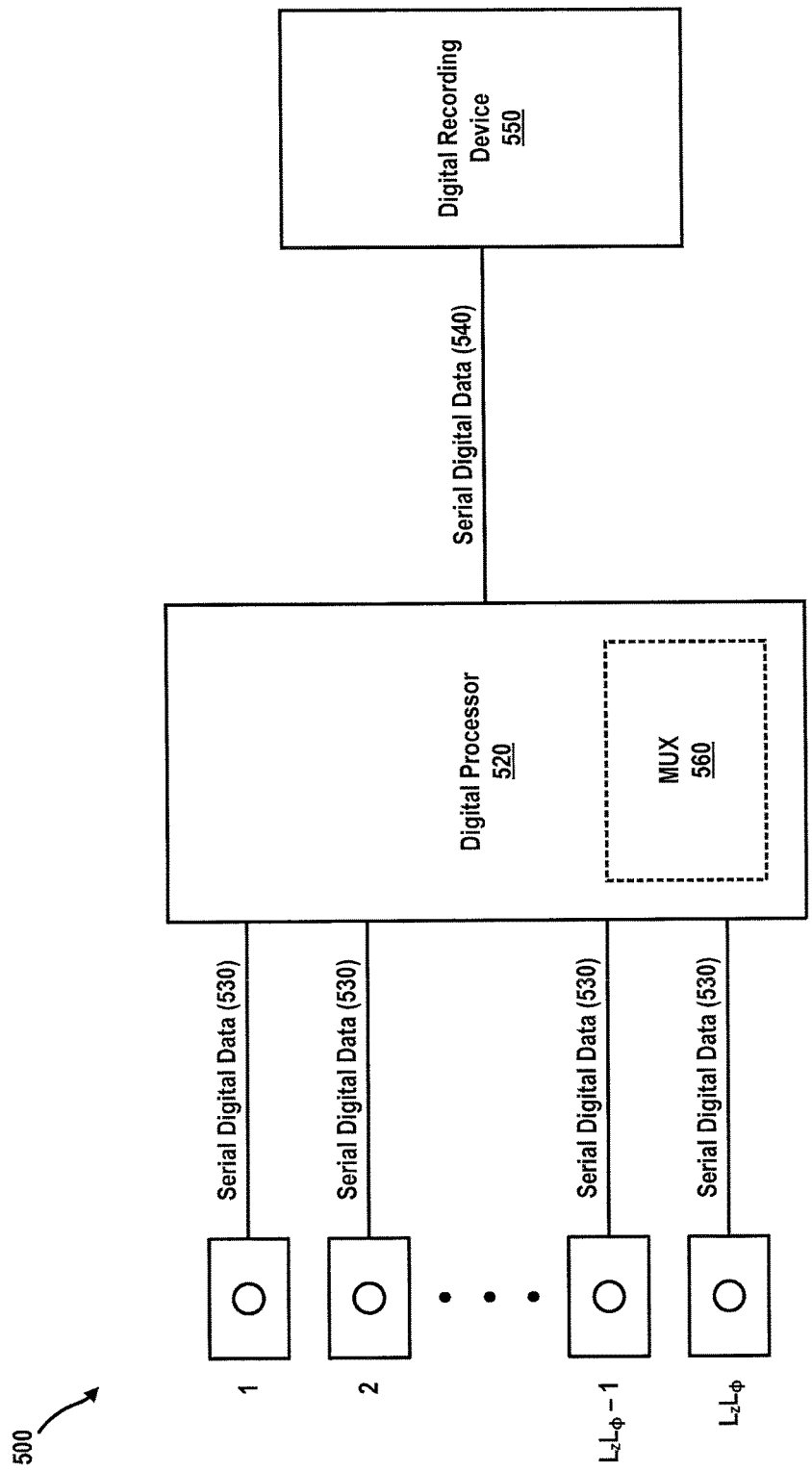
FIG. 5 is a block diagram illustrating an example microphone processing system according to one or more embodiments described herein.

FIG. 5 illustrates an example of such a microphone processing system 500 as that described above, and FIG. 6 shows details of the elevational and azimuthal processing that may be performed by a digital processor arranged in such a system.

The $L_\phi L_z$ microphones (which may be, for example, MEMS microphones) preferably produce serial digital outputs (530) which are connected to a digital processor 520. The processor 520 processes the microphone signals (which may optionally include multiplexing the signals (e.g., using optional multiplexer 560)) into a single data line (540) (which may itself consist of two or more serial data lines) that is fed to a digital data recording device 550 (e.g., a computer). The processor 520 may optionally apply delays directly to the serial sigma delta or pulse density bitstreams to implement vertical beamforming, and then carries out serial data conversion to a multi-bit format. Amplitude shading may then be applied to the multi-bit signals to further control the vertical beamforming response.

Figure 6:
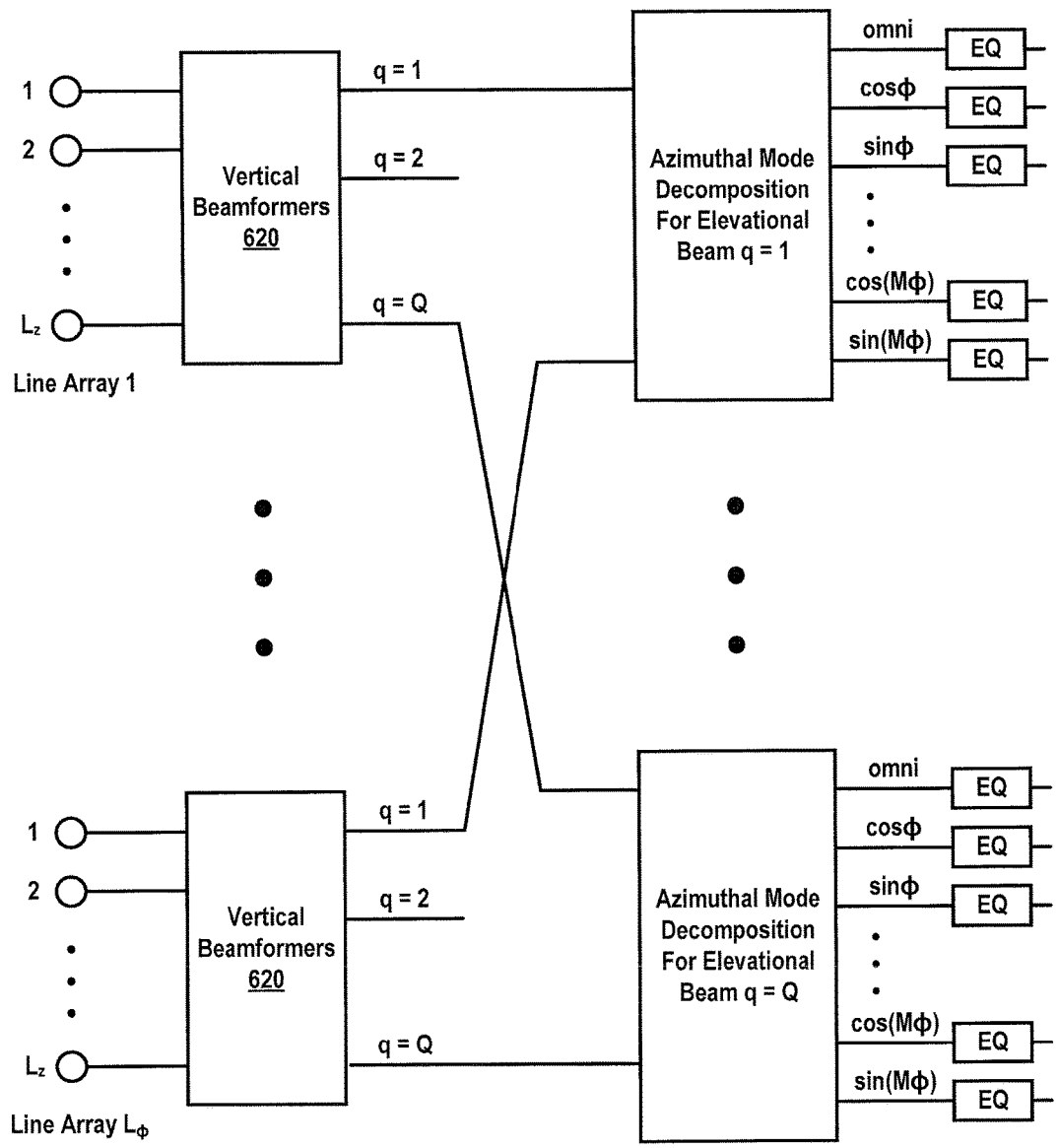
FIG. 6 is a block diagram illustrating an example form of spatial processing according to one or more embodiments described herein.

FIG. 6 illustrates an example form of spatial processing that may be performed by a digital processor (e.g., digital processor 520 as shown in FIG. 5) in accordance with one or more embodiments described herein. Each set of line array signals (e.g., Line Array 1 through Line Array $L_\phi$) is fed to a set of Q vertical beamformers 620, each designed to preferentially detect direction of arrival $\theta_q$. The Q beamformers 620 may use delayed bitstreams to provide delays, or these delays may be implemented directly on the converted multi-bit signals.

The Q beamformer outputs are further processed to produce azimuthal mode decompositions, typically by weighting the vertically beamformed outputs for a set of $L_\phi$ outputs associated with elevation q, at line array angles $\theta_l$, by weights of the form $\cos(m\phi_l)$ and $\sin(m\phi_l)$ and adding to produce a single mode response signal for the mth mode. Each mode response signal is then equalized by a mode equalizer specific to the azimuthal order m and to the elevation q, for example as given in equation (31). In accordance with at least one embodiment, the mode equalizer may be implemented as a finite impulse response (FIR) digital filter that produces a frequency response close to the response in equation (31). This FIR filter can be designed by methods known to those skilled in the art, such as, for example, representing equation (31) numerically at discrete frequencies and then using an inverse Fourier transform to produce a discrete FIR impulse response, or using a least-squares design method.

Figure 7:
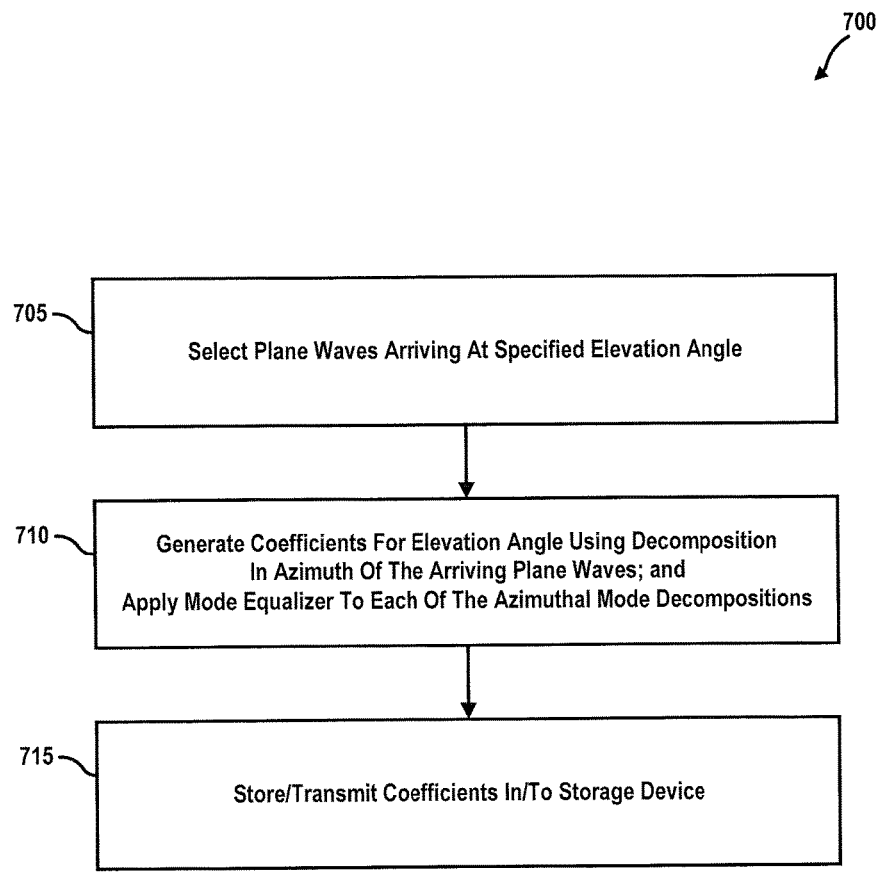
FIG. 7 is a flowchart illustrating an example method for recording a 3D sound field using a vertically-oriented cylindrical array according to one or more embodiments described herein.

FIG. 7 is an example process 700 for recording a 3D sound field using a vertically-oriented cylindrical array.

At block 705, plane waves arriving at a specified elevation angle may be received (e.g., selected) at a plurality (e.g., set) of vertical beamformers (e.g., vertical beamformers 620 as shown in FIG. 6). In accordance with at least one embodiment, the vertical beamformers may be part of a cylinder-shaped audio recording device (e.g., cylindrical microphone array 300 or 400 as shown in FIGS. 3 and 4, respectively, and described in detail above).

At block 710, cylindrical coefficients may be generated for the specified elevation angle using (e.g., based on) a decomposition in azimuth of the plane waves arriving at the specified elevation angle. In accordance with at least one embodiment described herein, block 710 may also include applying a mode equalizer to each of the azimuthal mode decompositions. The mode equalizer applied to each of the azimuthal mode decompositions may, for example, be specific to the azimuthal order and specified elevation. In addition, the azimuthal mode decompositions may be generated by assigning weights to a set of vertically beamformed outputs associated with the specified elevation, and combining (e.g., adding) the weighted outputs to produce the azimuthal mode decompositions.

In accordance with at least one embodiment, the example process 700 may optionally include, at block 715, storing or transmitting the coefficients (e.g., generated at block 710) in/to a storage device.

It should be noted that, in at least one embodiment, the plurality of vertical beamformers (e.g., that are part of a cylinder-shaped audio recording device, such as, for example, vertical beamformers 620 as shown in FIG. 6) may be configured to represent elevational information in the sound field for either a specified reproduction loudspeaker array, or for a prescribed maximum subjective resolution of sound in elevation.

Figure 8:
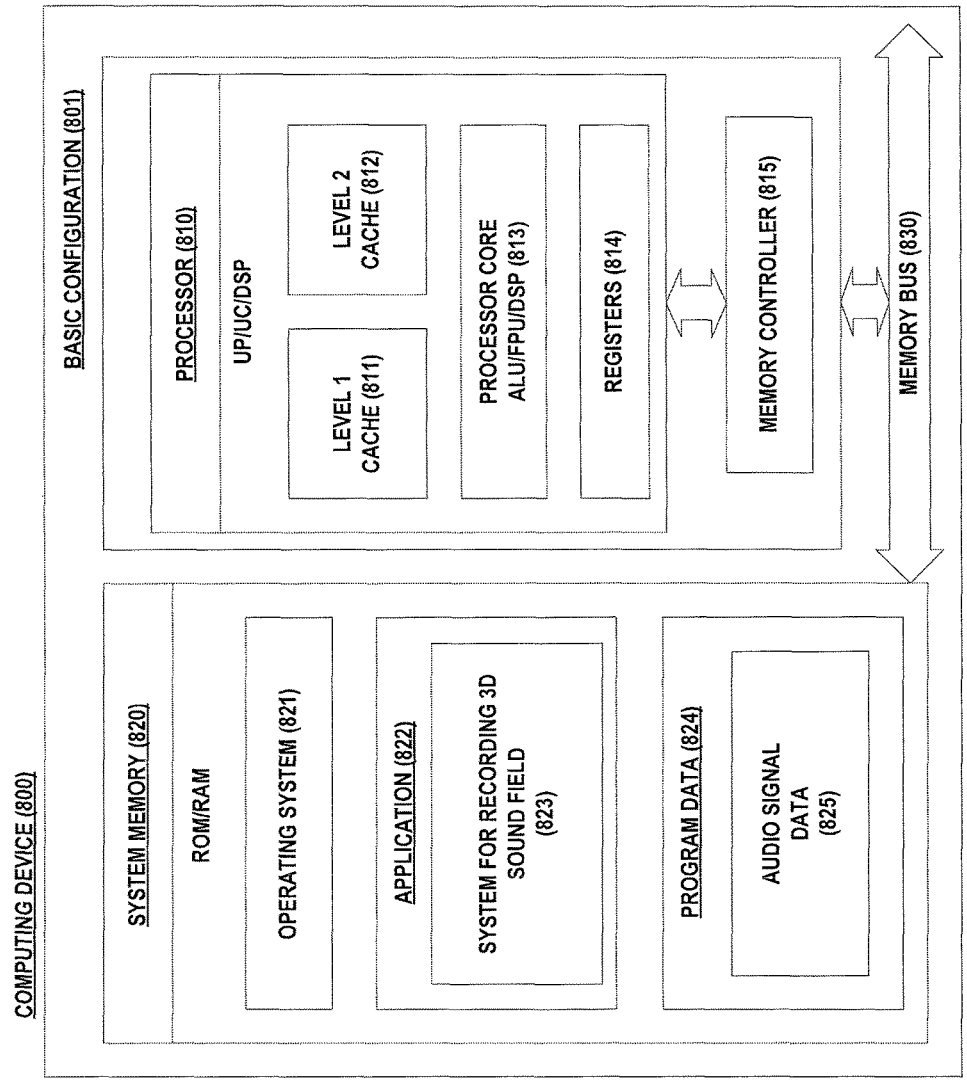
FIG. 8 is a block diagram illustrating an example computing device arranged for recording a 3D sound field using a vertically-oriented cylindrical array with multiple circular arrays arranged at different heights according to one or more embodiments described herein.

FIG. 8 is a high-level block diagram of an exemplary computing device (800) that is arranged for recording a 3D sound field using a vertically-oriented cylindrical array (e.g., cylindrical array 300 or 400 as shown in FIGS. 3 and 4, respectively) with multiple circular arrays at different heights in accordance with one or more embodiments described herein. For example, in accordance with at least one embodiment, computing device (800) may be (or may be a part of or include) digital processor 520 and/or digital recording device 550 as shown in FIG. 5 and described in detail above.

In a very basic configuration (801), the computing device (800) typically includes one or more processors (810) and system memory (820). A memory bus (830) can be used for communicating between the processor (810) and the system memory (820). Depending on the desired configuration, the processor (810) can be of any type including but not limited to a microprocessor (µP), a microcontroller (µC), a digital signal processor (DSP), or the like, or any combination thereof. The processor (810) can include one more levels of caching, such as a level one cache (811) and a level two cache (812), a processor core (813), and registers (814). The processor core (813) can include an arithmetic logic unit (ALU), a floating point unit (FPU), a digital signal processing core (DSP Core), or the like, or any combination thereof. A memory controller (815) can also be used with the processor (810), or in some implementations the memory controller (815) can be an internal part of the processor (810).

Depending on the desired configuration, the system memory (820) can be of any type including but not limited to volatile memory (such as RAM), non-volatile memory (such as ROM, flash memory, etc.) or any combination thereof. System memory (820) typically includes an operating system (821), one or more applications (822), and program data (824). The application (822) may include a system for recording a 3D sound field (823). In accordance with at least one embodiment of the present disclosure, the system for recording a 3D sound field (823) is designed to record and process one or more audio signals using a vertically-oriented cylindrical array with multiple circular arrays arranged at different heights, which provides a high-resolution in azimuth and a reduced resolution in elevation.

Program Data (824) may include stored instructions that, when executed by the one or more processing devices, implement a system (823) and method for recording a 3D sound field. Additionally, in accordance with at least one embodiment, program data (824) may include audio signal data (825), which may relate to, for example, sound generated from a source located within some proximity of the vertically-oriented cylindrical array. In accordance with at least some embodiments, the application (822) can be arranged to operate with program data (824) on an operating system (821).

The computing device (800) can have additional features or functionality, and additional interfaces to facilitate communications between the basic configuration (801) and any required devices and interfaces.

System memory (820) is an example of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 800. Any such computer storage media can be part of the device (800).

The computing device (800) may be implemented as a portion of a small-form factor portable (or mobile) electronic device such as a cell phone, a smartphone, a personal data assistant (PDA), a personal media player device, a tablet computer (tablet), a wireless web-watch device, a personal headset device, an application-specific device, or a hybrid device that include any of the above functions. In addition, the computing device (800) may also be implemented as a personal computer including both laptop computer and non-laptop computer configurations, one or more servers, Internet-of-Things systems, and the like.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In accordance with at least one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers, as one or more programs running on one or more processors, as firmware, or as virtually any combination thereof, and that designing the circuitry and/or writing the code for the software and/or firmware would be well within the skill of one of skill in the art in light of this disclosure.

In addition, those skilled in the art will appreciate that the mechanisms of the subject matter described herein are capable of being distributed as a program product in a variety of forms, and that an illustrative embodiment of the subject matter described herein applies regardless of the particular type of non-transitory signal bearing medium used to actually carry out the distribution. Examples of a non-transitory signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

The invention claimed is:

1. An apparatus for recording a three-dimensional sound field, the apparatus comprising:
 a cylindrical baffle;
 at least one processor; and
 a plurality of line arrays distributed around a circumference of the cylindrical baffle, each line array including microphone elements spaced apart from one another in a longitudinal direction of the cylindrical baffle, wherein the at least one processor is configured to produce a set of vertical beamformer responses for each of the line arrays, different vertical beamformer responses of the set of vertical beamformer responses having a maximum response at a different elevations relative to the microphone elements of the line array, and wherein the at least one processor is configured to process the vertical beamformer responses for different line arrays, each of the processed vertical beamformer responses having a maximum response for a specified elevation to produce azimuthal mode decompositions of the three-dimensional sound field at the specified elevation.

2. The apparatus of claim 1, wherein each set of vertical beamformer responses is processed in azimuth to produce cylindrical coefficients of the sound field at a specified elevation.

3. The apparatus of claim 1, wherein the cylindrical baffle has at least one rounded end to control diffraction effects.

4. The apparatus of claim 1, further comprising:
 one or more vertical beamformers to reduce diffraction effects at one or both ends of the cylindrical baffle.

5. The apparatus of claim 1, wherein the plurality of line arrays are positioned at regularly-spaced angles around the circumference of the cylindrical baffle.

6. The apparatus of claim 1, wherein the microphone elements of each line array are equally spaced apart from one another in the longitudinal direction of the cylindrical baffle.

7. The apparatus of claim 1, wherein the microphone elements of each line array are nonlinearly spaced apart from one another in the longitudinal direction of the cylindrical baffle such that a distance between adjacent microphone elements increases towards one or both ends of the array.

8. The apparatus of claim 1, wherein each microphone element is a micro-electro-mechanical system (MEMS) microphone.

9. A method for recording a three-dimensional sound field, the method comprising:
 receiving, at a plurality of vertical line arrays of a cylinder-shaped audio recording device, the three-dimensional sound field, the line arrays including microphone elements spaced apart from one another in a longitudinal direction on audio recording device;

producing a set of vertical beamformer responses for each of the line arrays, different vertical beamformer responses of the set of vertical beamformer responses having a maximum response at different elevation angles relative to the microphone elements in the line arrays;

generating, based on the vertical beamformer responses for a specified elevation angle produced for different line arrays azimuthal mode decompositions of the three-dimensional sound field arriving at the specified elevation angle, the azimuthal mode decompositions;

generating cylindrical coefficients for the specified elevation angle based on the azimuthal mode decompositions; and storing the cylindrical coefficients for the elevation angle on a storage device.

10. The method of claim 9, further comprising:
applying a mode equalizer to each of the azimuthal mode decompositions.

11. The method of claim 10, wherein the mode equalizer applied to each of the azimuthal mode decompositions is specific to the azimuthal order and specified elevation.

12. The method of claim 9, wherein generating the azimuthal mode decompositions includes:
assigning weights to a set of vertically beamformed outputs associated with the specified elevation; and
combining the weighted outputs to produce the azimuthal mode decompositions.

13. The method of claim 9, wherein the plurality of vertical beamformers are configured to represent elevational information in the sound field for a specified reproduction loudspeaker array.

14. The method of claim 9, wherein the plurality of vertical beamformers are configured to represent elevational information in the sound field for a maximum resolution of sound in elevation.

15. A system for recording a three-dimensional sound field, the system comprising:
system memory;
at least one processor coupled to the system memory; and
a non-transitory computer-readable medium associated with the at least one processor, the non-transitory medium having instructions stored thereon that, when executed by the at least one processor, causes the at least one processor to:

receiving, at a plurality of vertical line arrays of a cylinder-shaped audio recording device, the three-dimensional sound field, the line arrays including microphone elements spaced apart from one another in a longitudinal direction on audio recording device;

producing a set of vertical beamformer responses for each of the line arrays, different vertical beamformer responses of the set of vertical beamformer responses having a maximum response at different elevation angles relative to the microphone elements in the line arrays;

generating, based on the vertical beamformer responses for a specified elevation angle produced for different line arrays azimuthal mode decompositions of the three-dimensional sound field arriving at the specified elevation angle, the azimuthal mode decompositions;

generating cylindrical coefficients for the specified elevation angle based on the azimuthal mode decompositions; and storing the cylindrical coefficients for the elevation angle on a storage device.

16. The system of claim 15, wherein the instructions, when executed by the at least one processor, cause the at least one processor to:
apply a mode equalizer to each of the azimuthal mode decompositions.

17. The system of claim 16, wherein the mode equalizer applied to each of the azimuthal mode decompositions is specific to the azimuthal order and specified elevation.

18. The system of claim 16, wherein the instructions, when executed by the at least one processor, cause the at least one processor to:
assign weights to a set of vertically beamformed outputs associated with the specified elevation; and
combine the weighted outputs to produce the azimuthal mode decompositions.

19. The system of claim 15, wherein the plurality of vertical beamformers represent elevational information in the sound field for a specified reproduction loudspeaker array.

20. The system of claim 15, wherein the plurality of vertical beamformers represent elevational information in the sound field for a maximum resolution of sound in elevation.

* * * * *